United States Patent [19]

Carp et al.

[11] Patent Number: 4,623,976
[45] Date of Patent: Nov. 18, 1986

[54] AUTOMATIC CALIBRATION APPARATUS FOR AN AUTOMOTIVE CONTROL SYSTEM

[75] Inventors: Ralph W. Carp, Newport News; Mark C. Harvey, Yorktown, both of Va.

[73] Assignee: Allied Corporation, Morris Township, Morris County, N.J.

[21] Appl. No.: 590,320

[22] Filed: Mar. 16, 1984

[51] Int. Cl.⁴ .............................................. G01L 25/00
[52] U.S. Cl. .................................................... 364/571
[58] Field of Search ................................ 364/571, 424; 340/347 CC; 364/550, 551, 431.12; 73/116, 117.3

[56] References Cited

U.S. PATENT DOCUMENTS

| | | | |
|---|---|---|---|
| 3,935,427 | 1/1976 | Geul | 73/116 R |
| 4,271,402 | 6/1981 | Kastura et al. | 364/431.12 |
| 4,348,729 | 9/1982 | Sasayama et al. | 364/431.12 |
| 4,366,541 | 12/1982 | Mouri et al. | 364/571 |
| 4,401,949 | 8/1983 | Gold | 364/551 |
| 4,404,639 | 9/1983 | McGuire et al. | 364/424 |
| 4,441,359 | 4/1984 | Ezoe | 364/551 |

FOREIGN PATENT DOCUMENTS 2119095A 11/1983 United Kingdom ............... 364/424

*Primary Examiner*—Gary Chin
*Attorney, Agent, or Firm*—Russel C. Wells; Markell Seitzman

[57] ABSTRACT

An automatic calibration selection for an automotive control system allows the use of one basic electronic control unit (20) for a family of motor vehicles. In each motor vehicle, a unique valued resistor (10) is located in or adjacent to the wireharness and near the electronic control unit connector (12). This resistor (10) provides an input to a voltage divider network to select a voltage value representing the particular control parameters for the vehicle. The voltage operates to address (24) a read only memory (22) to place the proper calibration constants in the electronic control unit (20).

2 Claims, 1 Drawing Figure

AUTOMATIC CALIBRATION APPARATUS FOR AN AUTOMOTIVE CONTROL SYSTEM

This invention relates to an automotive control system and more particularly to a system for adapting a standard electronic control unit to a particular vehicle in which the unit is installed.

U.S. Pat. No. 3,935,427 issued on Jan. 27, 1976 teaches the use of pre-wiring the diagnostic connector on a motor vehicle to a predetermined identification code which is then matched with one of a plurality of data codes stored in a diagnostic tester. In this manner, the tester will be automatically compatible with the vehicle on which it is attached. The patent also teaches connecting several pins on the diagnostic connector through a binary system to generate an identification code in the tester. The code actuates the tester to apply the proper parameters to the vehicle being tested.

While the above identified patent solves the problem of connecting a universal tester to a vehicle for properly testing the vehicle, the invention herein permits an automotive manufacturer to make a single electronic control unit applicable to the several different families of the vehicle on which it may be attached. By its use the vehicle manufacturer will inventory only a few different control units for all the vehicles it manufacturers.

SUMMARY OF THE INVENTION

An automatic calibration selection for an automotive control system uses a vehicle mounted electronic control unit having a microprocessor based control system with a read-only memory. The read-only memory has a plurality of addressable calibration tables placed therein by the manufacturer during its fabrication. Each table corresponds to a particular vehicle configuration and has the various parameters connected therewith preloaded in the memory. The table selection system is characterized by a voltage divider circuit whereby a portion of the voltage divider is located in the electronic control unit and the remaining portion is located on the vehicle. The voltage divider is connected through a cable mounted connector to the electronic control unit.

The connector located within the electronic control unit connects the junction of the two portions of the voltage divider to an analog-to-digital converter. The voltage divider circuit generates a unique analog voltage indicating the characteristics of the vehicle. The analog-to-digital converter converts this unique signal to a digital signal for addressing and thereby selecting the calibration tables within the microprocessor.

It is a principle advantage of the invention to permit the vehicle manufacturer to have a single, or small number of different electronic control units that are, in totality, applicable to most of the family of vehicles it manufacturers. This, of course, reduces inventory and make field replacement of defective units much easier.

These and other advantages become apparent from the following detailed description taken in conjunction with the following drawing.

IN THE DRAWINGS

FIG. 1 is a block diagram of the selection system.

DETAILED DESCRIPTION

Figure 1:
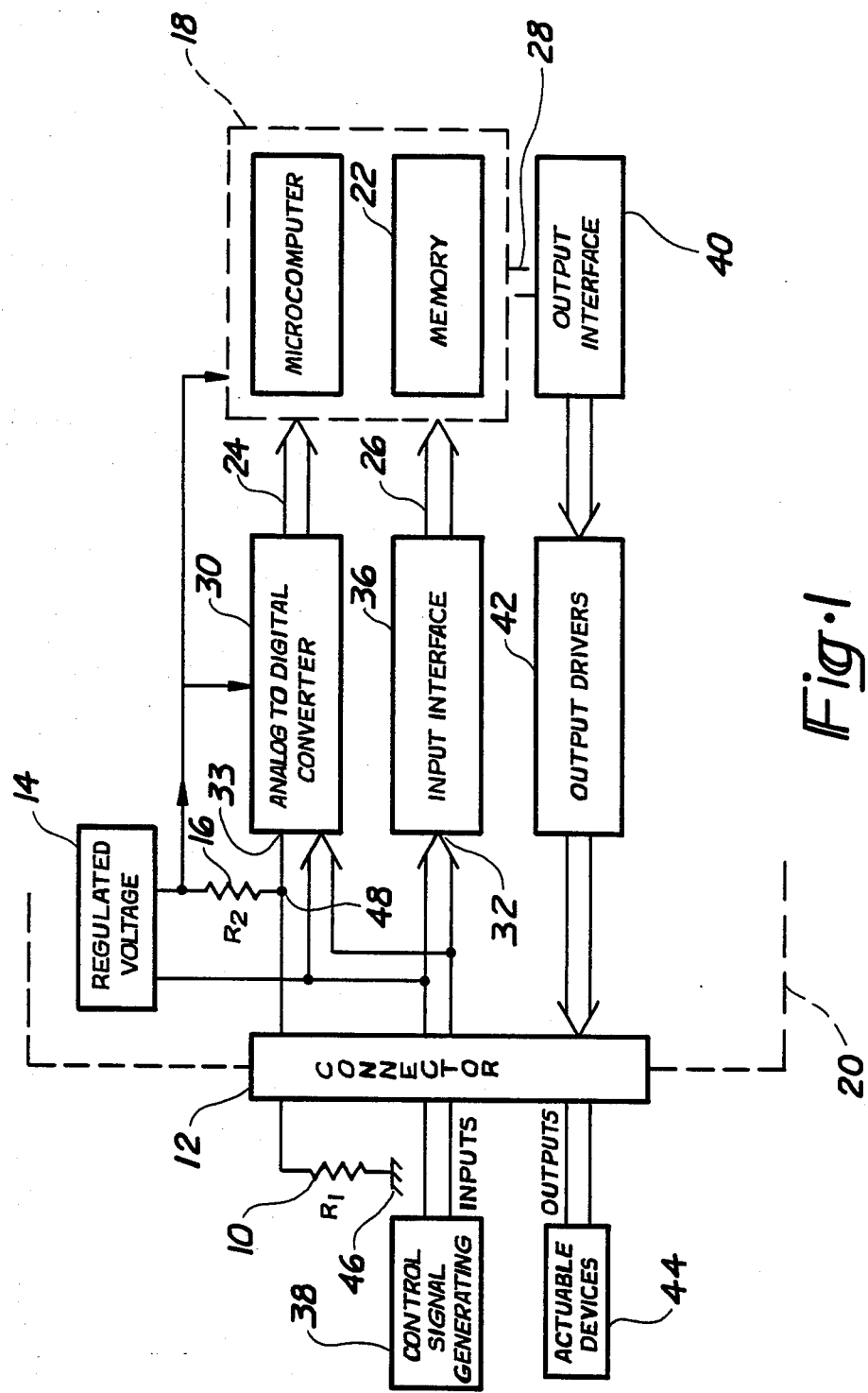

Referring to the FIGURE by the various characters and numerals of reference, FIG. 1 is a block diagram of the preferred embodiment of the selection system. FIG. 1 shows a vehicle identification resistor (R1) 10, a connector 12, a voltage regulator 14, a voltage divider resistor 16 and several components of a microprocessor 18.

The basic component of the system is, of course, the electronic control unit 20 which the vehicle manufacturer has developed to control one or many of several different operations of a motor vehicle. That is illustrated as a microcomputer based engine control system. For the purposes of this inveniton the microcomputer comprises a memory unit 22 and has several input and output terminals 24, 26, 28. Electrically connected to the input terminal 24 is an analog-to-digital converter 30 receiving analog signals at its inputs 32 and 33 and generating a digital signal to the microcomputer. Other inputs to the microcomputer are input interface circuits 36 receiving input voltage signals from sensors or other control signal generating devices 38. The control signals from these devices are supplied directly to the microcomputer through the input interface circuits 36. Connected to the output 28 of the microcomputer 18 is an output interface circuit 40 for supplying controlled signals to various types of output drivers 42. The drivers control or actuate one or more actuable devices 44 in the vehicle such as fuel injectors, transmission controls, motors, etc. The microcomputer 18 is fabricated on one or more circuit boards and the electronic control unit 20 is enclosed in a housing having a fixed connector 12 for attaching the electronic control unit to the wiring of the motor vehicle.

In the embodiment shown in FIG. 1, a voltage divider circuit 16, 10 comprises a first portion including a first resistor (R2) 16 connected to a regulated voltage supply 14 and a second portion comprising a second or vehicle identification resistor 10 connected to ground 46 or to the return line of the regulated voltage supply 14. The first and second portions of the voltage divided circuit 16, 10 are electrically connected together through the connector 12 and the junction 48 of the two portions is connected to the input 33 of the analog-to-digital converter 30.

The connector 12 also supplies the various input leads and the output leads from the electronic control unit 20 to the several elements or devices 38, 44 in the vehicle operation. The second portion of the voltage divider circuit includes vehicle identification resistor 10 mounted on the vehicle. This particular resistor 10 may have a value that is different for each of the various configurations of the vehicle. The return of the vehicle identification resistor 10 is typically connected to ground 46 on the vehicle but may be connected back through the connector 12 to the regulated voltage supply 14 ground in the electronic control unit 20.

In the electronic control unit 20 the first portion 16 of the voltage divider circuit, the first resistor, is connected to a regulated voltage supply 14. Therefore, at the junction 48 of the two resistors 10, 16 will be a voltage proportional to the relative values of the resistors. In the majority of the vehicles the identification resistor 10 is mounted on the vehicle and changes from vehicle to vehicle while the first portion 16 of the voltage divider circuit mounted in the electronic control unit 20 will typically remain constant. As the vehicle identification resistor 10 changes, the analog voltage at the junction 48 of the two resistors will vary therefore, the analog-to-digital converter 30 will convert the analog signal to various digital signals.

The microcomputer 18 will have stored in its read-only memory or an auxiliary programmable read-only memory 22 a plurality of calibration tables. These tables contain various data information relative to the vehicle systems to be controlled by electronic control unit 20. Each table is addressed by a digital signal generated as the result of the voltage divider circuit 10, 16. As an example, if a particular electronic control unit 20 will operate on any one of a family of ten different vehicles there will be ten different tables located in the memory 22. Each memory table will have a unique address compatible with the voltage divider circuit 10, 16. Thus, on the vehicle side of the electronic control unit 20 there will be one of ten different values of the vehicle identification resistor 10 causing the generation of the ten different addresses.

On the vehicle side of the connector 12 the vehicle identification resistor 10 may be fixedly mounted to the vehicle or imbedded in the cable which is supplied to the connector 12. Thus, when an electronic control unit is placed in the vehicle, the correct calibration table will be automatically addressed.

There has thus been shown and described an automatic calibration selection system for an automotive control system utilizing a vehicle mounted electronic control unit.

I claim:

1. An automatic calibration apparatus for an automotive control system utilizing a vehicle mounted electronic control unit having a microprocessor based control system including an addressable memory said apparatus comprising:

a voltage divider circuit having a first resistor and a second resistor said first resistor having a fixed value is located in the vehicle mounted electronic control unit and connected to a regulated voltage supply and said second resistor having one of a plurality of values, said one value is unique to the vehicle configuration, is mounted on the vehicle;

connector means for cable connecting said first and second resistors forming a junction between said first and second resistors of said voltage divider;

an analog-to-digital converter located in the electronic control unit and electrically connected to said junction for generating a digital signal in response to the voltage at said junction; and a plurality of addressable calibration tables stored in the memory wherein each table corresponds to one particular vehicle configuration, one of said tables being selected by said digital signal to automatically provide the calibration data required to calibrate the electronic control unit for the vehicle on which the electronic control unit is mounted.

2. A method for automatic calibration of an automotive control system utilizing a vehicle mounted electronic control unit having a microprocessor based control system including an addressable memory, the method comprising the steps of:

forming a voltage at the junction of the first and second resistors wherein said first resistor has a fixed value and is mounted in the electronic control unit and said second resistor has one of a plurality of values and is mounted on the vehicle, said first and second resistors being connected across a voltage supply;

generating a digitally valued signal in response to the voltage formed at the junction of said two resistors;

loading a plurality of calibration tables into a programmable read only memory means wherein each table has a unique address and contains calibration data for specific vehicle control system; and then addressing one of the tables by said digitally valued signal; and then loading one of said calibration tables in the microprocessor for automatically calibrating the electronic control unit according to the vehicle in which it is mounted.

* * * * *